United States Patent [19]

Kobler

[11] 4,049,903
[45] Sept. 20, 1977

[54] CIRCUIT FILM STRIP AND MANUFACTURING METHOD

[75] Inventor: Robert James Kobler, Winston-Salem, N.C.

[73] Assignee: AMP Incorporated, Harrisburg, Pa.

[21] Appl. No.: 677,184

[22] Filed: Apr. 15, 1976

Related U.S. Application Data

[63] Continuation of Ser. No. 517,124, Oct. 23, 1974, abandoned.

[51] Int. Cl.² .................... H01B 13/00; H05K 1/04
[52] U.S. Cl. ............................ 174/68.5; 29/589; 29/627; 174/52 PE; 357/70
[58] Field of Search ........... 174/68.5, DIG. 3, 52 PE; 29/195, 195.5, 193.5, 193, 625, 626, 628, 588, 589, 590, 591; 357/70, 65

[56] References Cited

U.S. PATENT DOCUMENTS

| 3,440,027 | 4/1969 | Hugle | 357/70 X |
| 3,537,175 | 11/1970 | St. Clair et al. | 357/70 X |
| 3,611,061 | 10/1971 | Segerson | 174/52 PE |
| 3,689,991 | 9/1972 | Aird | 174/DIG. 3 |
| 3,790,866 | 2/1974 | Meyer et al. | 357/70 X |
| 3,793,714 | 2/1974 | Bylander | 357/70 |
| 3,868,724 | 2/1975 | Perrino | 174/52 PE |
| 3,978,516 | 8/1976 | Noe | 357/70 |

Primary Examiner—Arthur T. Grimley
Attorney, Agent, or Firm—Frederick W. Raring; Robert W. Pitts; Jay L. Seitchik

[57] ABSTRACT

Circuit film strip comprises a continuous strip of plastic film having a repetitive pattern of conductors thereon and indexing holes along its side edges. The indexing holes comprise a layer of metal on the film which extends over a punched hole in the film. The metal layer has an etched hole therein which is produced by the same printing and etching process as is employed to produce the conductors so that the etched holes are precisely located with reference to the conductors.

4 Claims, 8 Drawing Figures

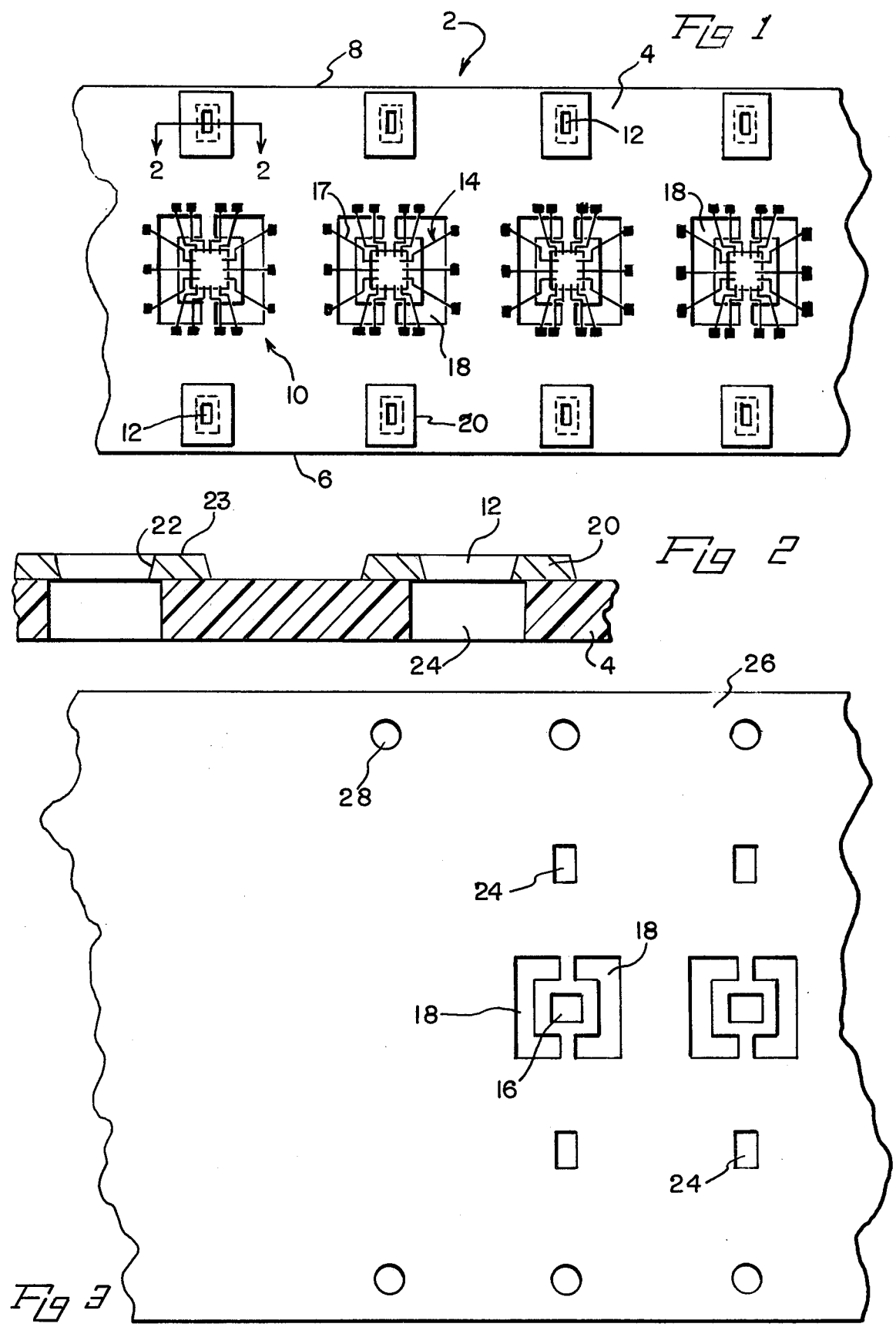

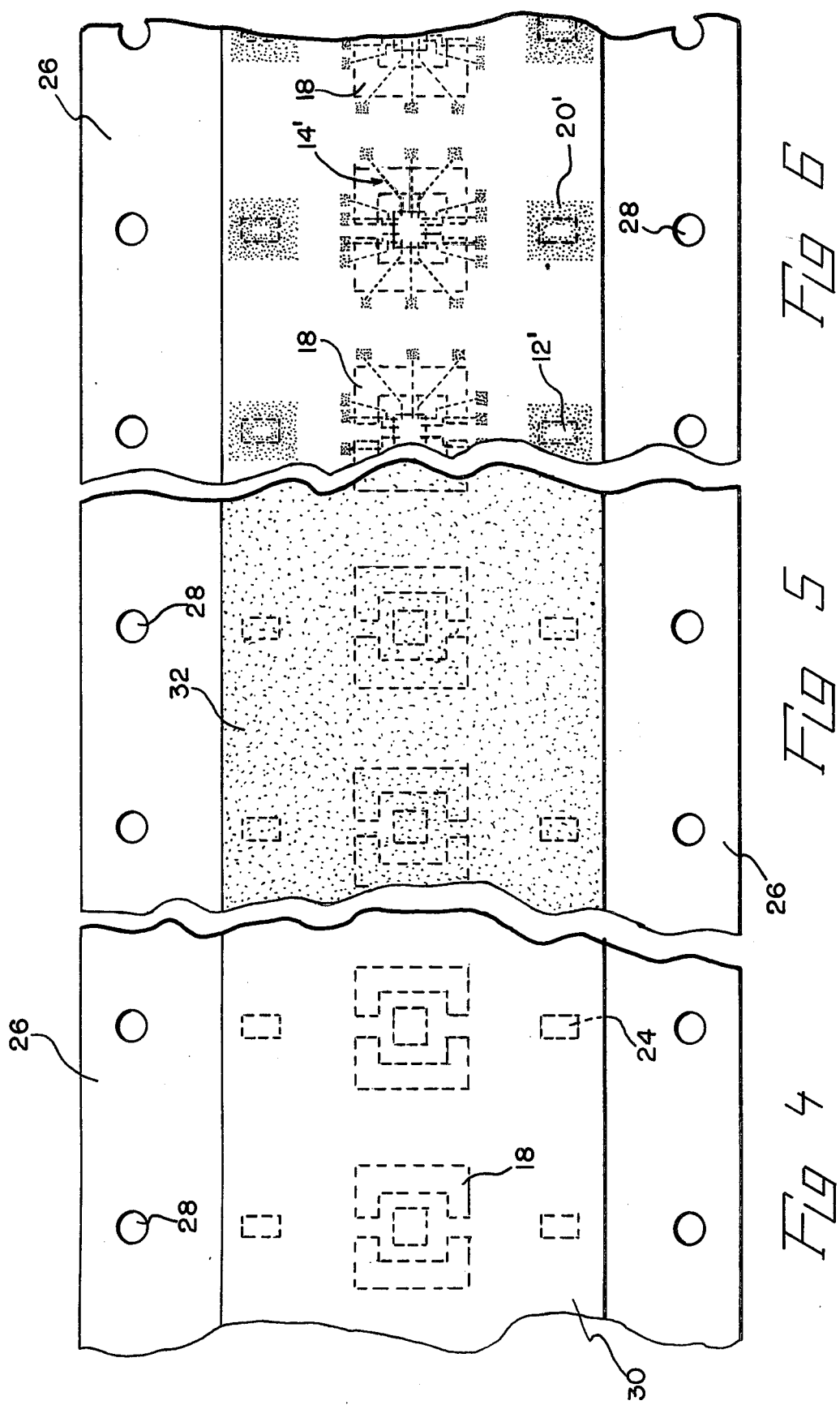

CIRCUIT FILM STRIP AND MANUFACTURING METHOD

This is a continuation of application Ser. No. 517,124 filed Oct. 23, 1974 now abandoned.

BACKGROUND OF THE INVENTION

This invention relates to circuit film strips and to methods for manufacturing such film strips.

The phrase "circuit film strip" is used herein with reference to a continuous strip of insulating film having indexing or sprocket holes extending along its side edges and having a repetitive pattern of conductors on one surface thereof. Circuit films of this type are being widely used in the electronics industry in the production of integrated circuit devices of the type comprising an integrated circuit chip to which a plurality of leads are bonded. The chip and portions of the leads which are adjacent to the chip may be encapsulated in a plastic body and the portions of the leads which extend externally of the plastic body are connected to circuitry on a printed circuit board or otherwise connected into electronic apparatus.

The IC chips are quite small and the bonding of the leads to the chips must be carried out with a high degree of precision. At the same time, the economic requirements of the electronics industry are such that all of the operations must be carried out at a low cost, preferably by methods involving a high degree of automation.

It is now common practice in the art to form the very fine leads which are to be bonded to an IC chip on a film similar to a cinematic film having sprocket or indexing holes at spaced intervals along its side edges. The film can then be fed through assembly and other processing machines so that the chips can be bonded to the ends of the leads and intermediate portions of the lead scan be bonded to a lead frame (a metal frame having leads of relatively coarse size). Thereafter, the plastic material can be molded around the chip and the leads to produce the finished integrated circuit unit in condition for use in an electronic apparatus.

It can be appreciated that the circuit film must be precisely positioned in all of the processing and/or assembly machinery discussed above because of the extremely small size of the strip, the leads on the film and the IC chip and the achievement of such precise positioning has proved to be a vexatious problem. This problem arises from the fact that it is extremely difficult to produce sprocket holes in the film which are in precise registry with the circuit patterns and if the sprocket holes are not in such precise registry, the circuit pattern which is located in a work station in a processing machine will not be located in that work station with a sufficient degree of precision to permit successful completion of the operation which is being carried out.

In accordance with the principles of the instant invention, sprocket holes or index holes can be produced which are at precise spaced-apart intervals on the circuit film so that every time the film is indexed a distance equal to the spacing between two adjacent holes, the distance the film is actually fed will lie within extremely close dimensional tolerances. Furthermore, each circuit pattern on a film made in accordance with the invention is specifically associated or related, in a dimensional sense, with two or more adjacent sprocket holes so that each individual circuit pattern can be located in the operating zone of the machine through which the film is being fed with an extremely high degree of precision and within extremely close dimensional tolerances.

It is an object of the invention to provide an improved circuit film strip. A further object is to provide a circuit film strip of improved dimensional precision as regards the indexing or sprocket holes in the film. A further object is to provide a circuit film strip having circuit patterns thereon and having indexing holes in which each circuit pattern is specifically dimensionally associated with two or more of the holes. A still further object is to provide an improved method of manufacturing circuit film strip.

These and other objects of the invention are achieved in preferred embodiments thereof which are briefly described in the foregoing specification, which are described in detail below, and which are shown in the accompanying drawing in which:

FIG. 1 is a plan view of a circuit film strip in accordance with the invention.

FIG. 2 is a view taken along the lines 2—2 of FIG. 1.

FIG. 3 is a plan view of a strip of plastic film showing initial punching steps which are carried out in the practice of the invention.

FIGS. 4–7 are a series of plan views illustrating successive steps in the manufacture of circuit film strip in accordance with the invention.

Figure 7:
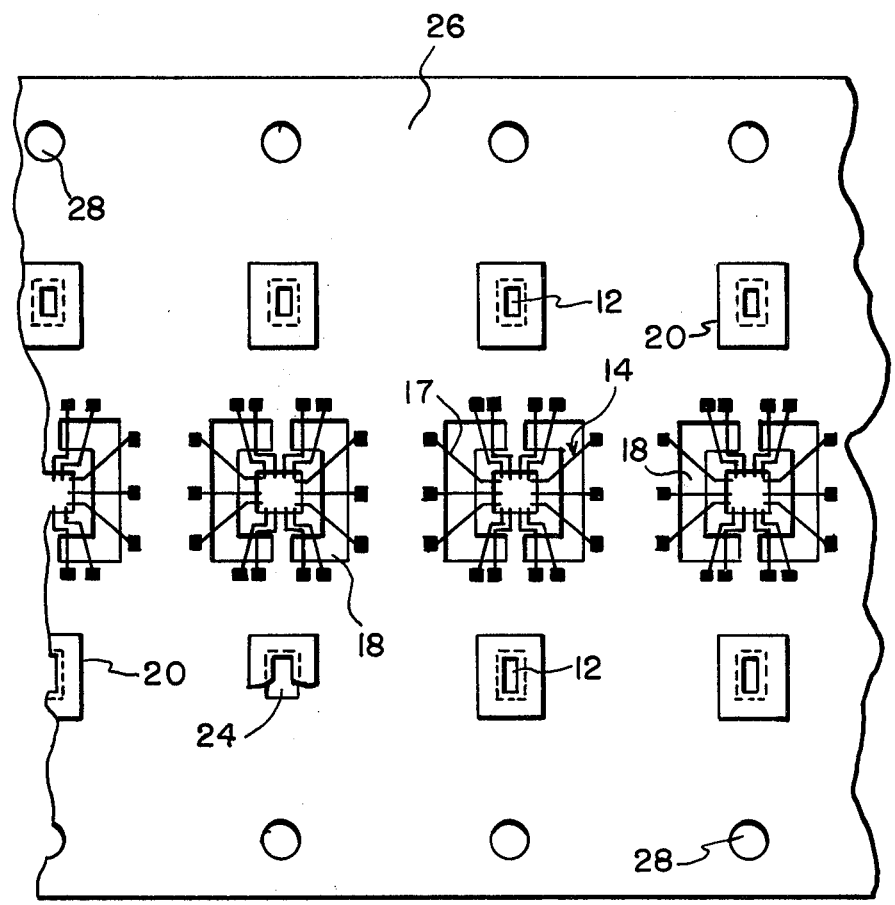
Figure 8:
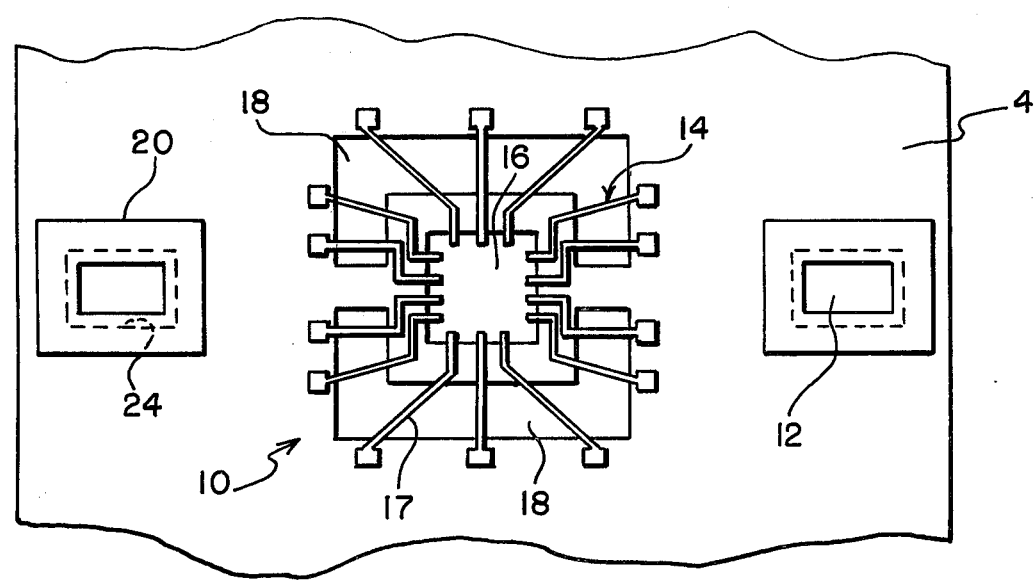
FIG. 8 is a plan view on an enlarged scale of a short section of the circuit film strip of FIG. 1.

Referring first to FIGS. 1 and 8, one foot of circuit film strip 2 in accordance with the invention, comprises a continuous strip 4 of plastic having parallel side edges 6, 8 and having repetitive circuits 10 at spaced apart intervals. Sprocket or locating holes 12 are provided for locating the film in a processing machine, each sprocket hole extending through an isolated island 20 of metal on the upper surface of the film 4 and each sprocket hole being in alignment with an oversize punched hole 24 as shown in FIG. 2.

In a disclosed embodiment, each of the circuit patterns 10 comprises a plurality of conductors 14 which radiate from a common central location and which have inner ends extending over a punched square hole 16. Intermediate portions 17 of each lead extend over opposite U-shaped openings 18 in the film which surround the central square hole 16. It should be mentioned at this point that the IC chip would be bonded to the inner ends of the conductors 14 and the intermediate portions 17 of these conductors would be bonded to the leads of a conventional lead frame. Some appreciation of the relative sizes of the parts can be gained from the fact that the film may have a width of 0.628 inches and the distance between adjacent circuit patterns will commonly be 0.300 inches. The conductors may have a thickness of about 0.0013 inches and a width as measured in the plane of FIG. 1 of about 0.003 inches.

The conductors 14, the islands 20 and the holes 12 are produced by etching, as will be described below, and each pair of sprocket holes on each side of each circuit bend are precisely located with the immediate circuit pattern 10 so that the individual circuit patterns can be precisely located in a processing machine. The manner of achieving precisely these dimensional relations will be apparent from the description which follows of one preferred method of manufacturing the circuit strip 2.

The starting material in the manufacturing process is a relatively wide strip 26 of film which may be of a polyimide having a thickness of about 0.006 inches. Advantageously, the film may be provided on its upper surface with a coating of adhesive each as a modified epoxy in the B stage. The film is first fed through a punching die and outer index holes 28 are punched at regular intervals along the side edges of the film. Thereafter, the oversided holes 24, the central square holes 16 and the U-shape openings 18 are punched in the film as shown in FIG. 3. The circular holes 28 cooperate with feed sprockets and/or aligning pins in the apparatus used to produce the finished circuit strip; for example, the strip may be fed through the apparatus for laminating, coating, printing and etching the strip as described below by sprocket wheels having teeth which enter these holes 28.

In the next step of the manufacture process (FIG. 4), a conductive metal strip 30 is bonded to the surface of the film by feeding the film and the metal strip through pressure rolls and heating the film so as to activate the epoxy bonding agent. The metal strip 30 may advantageously be of electro-deposited copper having a thickness of about 0.0014 inches, electrodeposited copper being preferable for the reason that one surface of electro-deposited copper strip has a slight degree of roughness which facilitates the bonding operation.

After lamination of the copper strip 30 for the plastic strip 26, the upper surface of the film is provided with a resist composition generally indicated by the stippled surface 32, FIG. 5. The film is then advanced to a printing station by a "step-and-repeat" feeding mechanism. A mask is placed over the resist coated strip 30 and the resist is exposed in the areas shown at 20' and 14' in FIG. 6. As will be explained below, the precise location of the index or sprocket holes 12 is achieved by virture of this step of using a single mask to expose the areas 20' and the areas 14'.

Thereafter, the resist material which lies outside the area 14' and 20' and which was not exposed or activated is washed from the upper surface of the strip 30 and the strip is contacted with a suitable etchant such as ferric chloride or ammonium persulphate. During the etching process, all of the copper which is not covered by the resist is etched away but the coated areas such as the islands 20 and the conductors 14 remain. The etching process, by means of which the holes 12 are produced, results in sloping sidewalls shown at 22 in FIG. 2 which define the sides of the holes 12, this slope being a result of the fact that the upper portions of the sidewalls are in contact with the etchant for a longer period of time than the lower portions. After completion of the etching process and removal of the resist from the upper surfaces of the conductors and the islands 20, the marginal side portions of the strip 26 are carefully trimmed to produce the continuous strip 2 having parallel side edges 6 and 8.

As previously mentioned, the precise location of each pair of index holes 12 with respect to the adjacent circuit pattern 10 is achieved by virtue of the fact that a single mask which is similar to a photographic negative is used to produce each circuit pattern 14' and its associated areas 20'. This high degree of precision is achieved by virtue of the fact that the exposure mask is produced by first making the "artwork", a representation on a greatly enlarged scale of the pattern 10 and the associated holes 12 required on the strip. This artwork can be produced to a reasonably high degree of precision and by photographic techniques, it is reduced to the size required for the exposure process, the reduction being 50 to 1 or even 100 to 1. The high level of dimensional precision achieved in the artwork is improved during the photographic reduction process and the precise relationship of the areas 20' to the areas 14' is thereby improved. The etching process thus results in the achievement of the etched holes 12 are in precise registry with an associated circuit pattern 10.

The advantages achieved in the practice of the invention can be appreciated from a comparison of the degree of precision achieved by the instant invention with present practice. It the sprocket holes in the film are punched (as in prior art practice) and the circuit patterns 10 applied to the film using the centers of the punched holes as reference points, the best registration which can be obtained between the holes and the associated circuit pattern will be limited to a tolerance of ± 0.005 inches; in other words, a given circuit patterns 10 on the strip 4 which should have its center in precise alignment with the centers of punched sprocket holes which are adjacent to the side edges of the strip may actually have its center as much as 0.005 inches offset in either direction along the length of the strip from an imaginary line drawn between the centers of the sprocket holes. If, in accordance with the invention, the sprocket holes are formed with a mask which deliniates a circuit pattern and two associated sprocket holes and the holes are etched as described above, the center of the circuit pattern will be offset from the imaginary line drawn between the centers of the hole by no more than 0.00005 inches which, for all practical purposes, is a zero tolerance.

Modifications of the invention will be apparent to those skilled in the art. The principle can be employed wherever etched circuits are required on film in combination with precisely located sprocket holes. If desired, two or more sprocket holes can be associated with each circuit pattern and/or each mask can contain images for two or more circuit patterns. A continuous exposure process rather than a step and repeat process can be employed if desired although the step and repeat processes are generally preferred at present.

What is claimed is:

1. Circuit film strip means comprising:
    a continuous strip of insulating material, said strip having parallel side edges,
    a row of spaced-apart punched holes in said strip extending along each of said side edges,
    a layer of metal on one side of said strip in surrounding, and partially covering relationship to, each of said punched holes,
    an etched sprocket hole in each of said layers of metal, each of said etched holes being centrally located over its associated punched hole and being smaller than its associated punched hole, and
    repetitive spaced apart patterns of etched conductors between said side edges, said etched conductors and said etched sprocket holes having been formed in the same photo etching process by the use of a one mask means for said conductors and said sprocket holes so that each of said patterns is in registry with at least two adjacent etched sprocket holes with the degree of precision of a photo resist printing and etching process whereby,
upon feeding said strip through a processing apparatus, each of said patterns will be located in said processing apparatus to the degree of precision of the photo resist printing and etching process.

2. Circuit film strip means as set forth in claim 1, said etched holes being rectangular.

3. Circuit film strip means as set forth in claim 1, each of said patterns of etched conductors comprising a plurality of conductors extending towards a chip mounting area.

4. Circuit film strip means as set forth in claim 3, each of said patterns being in registry with two adjacent sprocket holes.

* * * * *